(12) United States Patent
Tagami

(10) Patent No.: US 8,113,725 B2
(45) Date of Patent: Feb. 14, 2012

(54) OPTICAL MODULE AND METHOD FOR MANUFACTURING SAME

(75) Inventor: Yuichi Tagami, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 323 days.

(21) Appl. No.: 12/564,274

(22) Filed: Sep. 22, 2009

(65) Prior Publication Data
US 2010/0303405 A1    Dec. 2, 2010

(30) Foreign Application Priority Data
May 26, 2009 (JP) .................................. 2009-126952

(51) Int. Cl.
*G02B 6/36* (2006.01)
*H01L 33/00* (2010.01)
*H01L 31/0232* (2006.01)

(52) U.S. Cl. .............................. 385/92; 257/98; 257/432

(58) Field of Classification Search .......................... None
See application file for complete search history.

(56) References Cited

U.S. PATENT DOCUMENTS

| | | | |
|---|---|---|---|
| 6,335,548 B1 * | 1/2002 | Roberts et al. ................... | 257/98 |
| 6,407,438 B1 * | 6/2002 | Severn ............................ | 257/433 |
| 6,504,107 B1 * | 1/2003 | Kragl ............................ | 174/260 |
| 2004/0256687 A1 * | 12/2004 | Omori ............................ | 257/433 |
| 2009/0212306 A1 * | 8/2009 | Bogner et al. ................... | 257/98 |

FOREIGN PATENT DOCUMENTS
JP    2007-180275    7/2007

* cited by examiner

*Primary Examiner* — Sarah Hahm
(74) *Attorney, Agent, or Firm* — Turocy & Watson, LLP

(57) ABSTRACT

An optical module includes: an optical semiconductor section including a first lead, a second lead with one end portion opposed to one end portion of the first lead, an optical semiconductor element bonded onto the first lead, and a first molded body in which the optical semiconductor element, the one end portion of the first lead, and the one end portion of the second lead are embedded; and an optical element section including a third lead, a fourth lead with one end portion opposed to one end portion of the third lead, and a second molded body in which the one end portion of the third lead and the one end portion of the fourth lead are embedded and which can change the optical path of at least one of emitted light from the optical semiconductor element and incident light on the optical semiconductor element. The other end portion of the first lead and the other end portion of the second lead protrude from the first molded body in directions opposite to each other. The other end portion of the third lead and the other end portion of the fourth lead protrude from the second molded body in directions opposite to each other. The protruding first lead and the protruding third lead are joined to form a metal junction. The protruding second lead and the protruding fourth lead are joined to form a metal junction. And at least one of the first and second leads and the third and fourth leads have a bent portion which is convex outward.

20 Claims, 8 Drawing Sheets

OPTICAL MODULE AND METHOD FOR MANUFACTURING SAME

ROSS-REFERENCE TO RELATED APPLICATIONS

This application is based upon and claims the benefits of priorities from the prior Japanese Patent Application NO. 2009-126952, filed on May 26, 2009; the entire contents of which are incorporated herein by reference.

BACKGROUND OF THE INVENTION

1. Field of the Invention

This invention relates to an optical module and a method for manufacturing the same.

2. Background Art

In conventional optical interconnection between and inside equipments and short-haul optical communication, the amount of transmitted data has been small in many cases. However, the transmitted data is increasingly growing in capacity to address image transmission and the like.

To transmit high capacity of data while maintaining high transmission quality, it is important to accurately align optical axes among optical elements such as lenses, optical semiconductor elements, and optical fibers, thereby reducing waveform distortion. Furthermore, optical modules for optical interconnection and short-haul optical communication are required to achieve high mass productivity.

JP-A-2007-180275 (Kokai) discloses an example technique for an optical semiconductor device, which achieves both downsizing and cost reduction using a simple structure. The optical semiconductor device of this example includes a lead frame with an optical semiconductor element mounted thereon, an auxiliary frame, a buffer resin portion covering the optical semiconductor element, and a mold resin portion. Thus, it is possible to achieve high coupling efficiency, high optical transmission quality, superior environment resistance and the like. However, the accuracy of optical axis alignment is not sufficient, and the mass productivity also needs to be improved.

SUMMARY OF THE INVENTION

According to an aspect of the invention, there is provided an optical module including: an optical semiconductor section including a first lead, a second lead with one end portion opposed to one end portion of the first lead, an optical semiconductor element bonded onto the first lead, and a first molded body in which the optical semiconductor element, the one end portion of the first lead, and the one end portion of the second lead are embedded; and an optical element section including a third lead, a fourth lead with one end portion opposed to one end portion of the third lead, and a second molded body in which the one end portion of the third lead and the one end portion of the fourth lead are embedded and which can change the optical path of at least one of emitted light from the optical semiconductor element and incident light on the optical semiconductor element, the other end portion of the first lead and the other end portion of the second lead protruding from the first molded body in directions opposite to each other, the other end portion of the third lead and the other end portion of the fourth lead protruding from the second molded body in directions opposite to each other, the protruding first lead and the protruding third lead being joined to form a metal junction, the protruding second lead and the protruding fourth lead being joined to form a metal junction, and at least one of the first and second leads and the third and fourth leads having a bent portion which is convex outward.

According to another aspect of the invention, there is provided an optical module including: an optical semiconductor section including a first lead, a second lead with one end portion opposed to one end portion of the first lead, an optical semiconductor element bonded onto the first lead, and a first molded body in which the optical semiconductor element, the one end portion of the first lead, and the one end portion of the second lead are embedded; an optical element section including a third lead, a fourth lead with one end portion opposed to one end portion of the third lead, and a second molded body in which the one end portion of the third lead and the one end portion of the fourth lead are embedded and which can converge at least one of emitted light from the optical semiconductor element and incident light on the optical semiconductor element; and a ferrule guide portion including a fitting portion fitted with the second molded body and a through hole in which an optical fiber can be inserted, the other end portion of the first lead and the other end portion of the second lead protruding from the first molded body in directions opposite to each other, the other end portion of the third lead and the other end portion of the fourth lead protruding from the second molded body in directions opposite to each other, the protruding first lead and the protruding third lead being joined to form a metal junction, the protruding second lead and the protruding fourth lead being joined to form a metal junction, and at least one of the first and second leads and the third and fourth leads having a bent portion which is convex outward.

According to another aspect of the invention, there is provided a method for manufacturing an optical module, including: bonding an optical semiconductor element onto a first lead of a first lead frame region which includes the first lead, a second lead with one end portion opposed to one end portion of the first lead, and a frame portion supporting the first and second lead; forming a first molded body so that the one end portion of the first lead, the one end portion of the second lead, and the optical semiconductor element are embedded therein and that the other end portion of the first lead and the other end portion of the second lead protrude therefrom in directions opposite to each other; forming a second molded body, on a second lead frame region which includes a third lead, a fourth lead with one end portion opposed to one end portion of the third lead, and a frame portion supporting the third and fourth lead, so that the one end portion of the third lead and the one end portion of the fourth lead are embedded therein and that the other end portion of the third lead and the other end portion of the fourth lead protrude therefrom in directions opposite to each other; forming a metal junction by joining the first and third leads with the second and fourth leads while aligning a guide hole provided in the frame portion of the first lead frame region with a guide hole provided in the frame portion of the second lead frame region; cutting the first and second leads away from the frame portion of the first lead frame region; and cutting the third and fourth leads away from the frame portion of the second lead frame region.

DETAILED DESCRIPTION OF THE INVENTION

Embodiments of the invention will now be described with reference to the drawings.

Figure 1A:
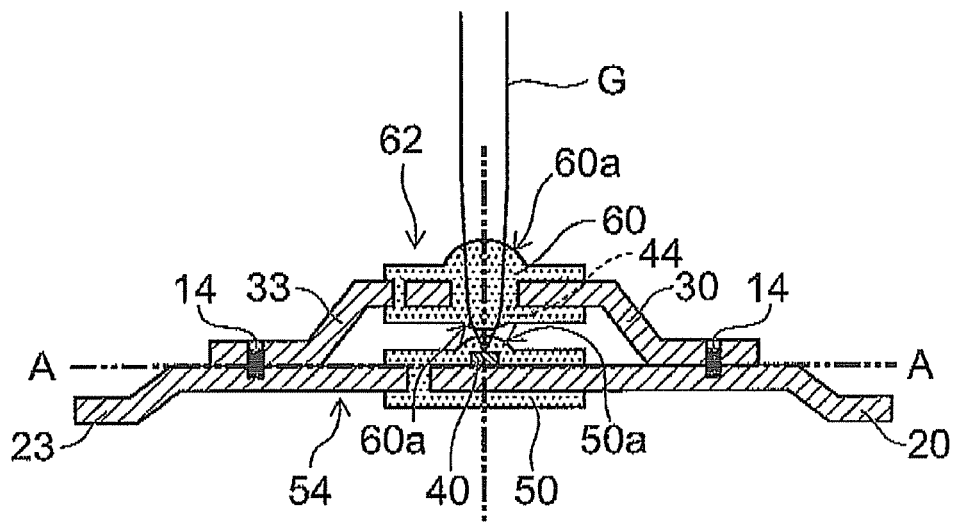
FIG. 1A to 1C are schematic views of an optical module according to a first embodiment.
Figure 1B:
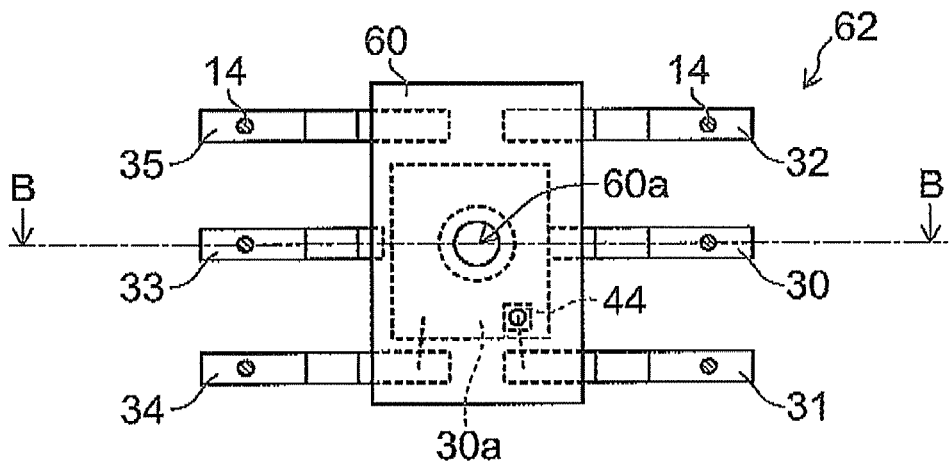
Figure 1C:
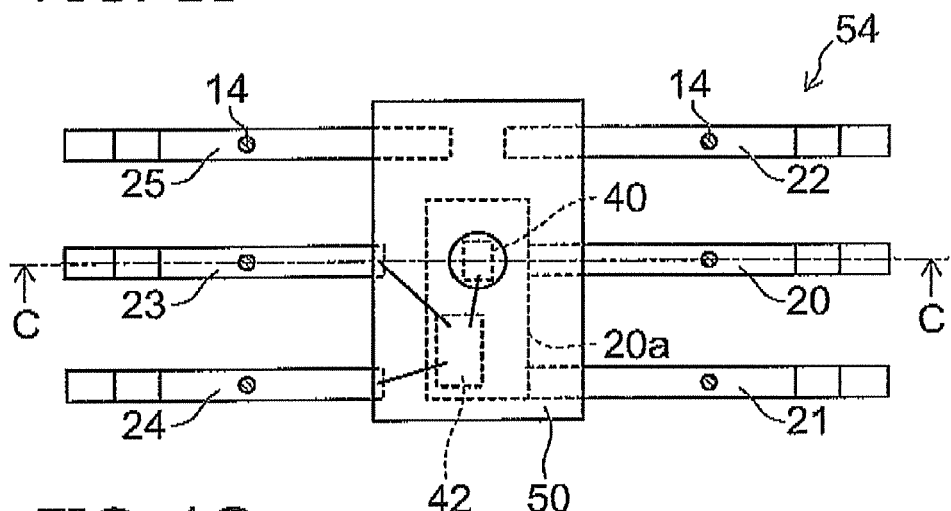

FIG. 1A is a schematic cross-sectional view of an optical module according to a first embodiment, FIG. 1B is a schematic plan view of an optical element section, and FIG. 1C is a schematic plan view of an optical semiconductor section.

The optical module includes an optical semiconductor section 54 and an optical element section 62 opposed thereto.

Among them, the optical semiconductor section 54 includes an optical semiconductor element 40, a first lead 20 with the optical semiconductor element 40 bonded thereto, a second lead 23 with one end portion opposed to one end portion of the first lead 20, and a first molded body 50 in which the optical semiconductor element 40, one end portion of the first lead 20, and one end portion of the second lead 23 are embedded. The other end portion of the first lead 20 and the other end portion of the second lead 23 protrude from the first molded body 50 in directions opposite to each other.

The optical semiconductor element 40 is illustratively a light emitting element, such as LED (light emitting diode), LD (laser diode), and VCSEL (vertical cavity surface emitting laser), or a light receiving element, such as PD (photodiode).

On the other hand, the optical element section 62 includes a third lead 30 forming a metal junction with the first lead 20, a fourth lead 33 with one end portion opposed to one end portion of the third lead 30 and forming a metal junction with the second lead 23, and a second molded body 60 in which one end portion of the third lead 30 and one end portion of the fourth lead 33 are embedded and which can change an optical path of one of emitted light from the optical semiconductor element 40 and incident light toward the optical semiconductor element 40. The other end portion of the third lead 30 and the other end portion of the fourth lead 33 protrude from the second molded body 60 in directions opposite to each other.

Each lead illustratively has a thickness of 0.25 mm and a width of 0.3 to 1 mm.

The optical element section 62 is illustratively a molded body made of a translucent resin with a refractive index in the range from 1.3 to 2.0, for instance. Hence, it can change the optical path of emitted light G from the optical semiconductor section 54 or incident light toward the optical semiconductor section 54. For instance, if the optical semiconductor element 40 is a VCSEL and the optical element section 62 is a convex lens, then a transmitting optical module shown in FIG. 1 is realized. Here, FIG. 1B is a plan view as viewed toward an upper direction along line A-A, and FIG. 1C is a plan view as viewed toward a lower direction along line A-A. Thus, FIG. 1A is a cross-sectional view of the optical module in which the optical semiconductor section 54 and the optical element section 62 are superposed together along line B-B and line C-C, and the leads are joined.

One end portion of the first lead 20 and one end portion of a lead 21 both constitute a die pad 20a to which the VCSEL 40 and its driving IC 42 are bonded using conductive paste or the like. One electrode of the VCSEL 40 is connected to the driving IC 42 by a bonding wire. The driving IC 42 is connected to the second lead 23 and a lead 24 by bonding wires. The first molded body 50 is illustratively made of a resin translucent to emitted light from the VCSEL 40, and its upper surface has a convex lens surface 50a, which can converge the emitted light. Alternatively, it may be a flat surface instead of the convex lens surface 50a.

On the other hand, one end portion of the third lead 30 has a through hole, and has at a corner a photodiode 44 for monitoring the intensity of the emitted light from the VCSEL 40. One electrode of the photodiode 44 is connected to a lead 31 by a bonding wire, and the other electrode is connected to a lead 34 by a bonding wire. The second molded body 60 has a convex lens surface 60a whose optical axis is generally aligned with an optical axis 52 of the emitted light of the VCSEL 40 so that the optical path can be changed by converging the emitted light G.

The first molded body 50 and the second molded body 60 may be different in material, but the molding process is simplified if they are made of the same material. In the case where the emitted light from the VCSEL 40 has a visible wavelength, a visible light transmitting resin can be used. In the case where it is infrared light, a visible light shielding resin can be used to reduce disturbance light.

In this example, the lead on the optical element section 62 side has a bent portion so that the first molded body 50 and the second molded body 60 are held at an appropriate spacing. The first molded body 50 and the second molded body 60 each have a convex lens surface, for instance. By varying a focal length of at least one of the convex lenses, the optical path from the VCSEL 40 can be changed, and its beam spread can be controlled. Also by varying the distance between the first molded body 50 and the second molded body 60, the optical path from the VCSEL 40 can be changed, and its beam spread can be controlled. Thus, the degree of freedom in controlling the beam spread can be increased. Here, the lens surface is not limited to a spherical surface, but can be an aspherical surface or a Fresnel zone plate. The bent portion can alternatively be provided on the optical semiconductor section 54 side.

The lead on the optical element section 62 side has a through hole. Thus, when the lead frames are superposed together, a metal junction 14 is readily formed from the opposed lead and the neighborhood of the through hole using such methods as laser welding, resistance welding, ultrasonic bonding, thermocompression bonding, and brazing.

In the case where the optical semiconductor element 40 is a photodiode, a receiving optical module can be realized by replacing the driving IC 42 by, for instance, a transimpedance amplifier, limiting amplifier, 3R circuit and the like. Multiplexed signals can be transmitted by replacing the driving IC 42 by a MUX (multiplexer), and multiplexed signals can be received by replacing the driving IC 42 by a DEMUX (demultiplexer).

In the optical module shown in FIG. 1, a transmission path can be space or an optical fiber. In the case where the optical module is used for transmission, because of its high accuracy in optical axis alignment, a transmission bandwidth required for signal transmission at a rate of 1 Gbps, for instance, can be sufficiently ensured. Thus, it can be used for short-haul optical communication, and optical interconnection between and inside equipments for high capacity data including images.

Furthermore, a high-brightness light emitting device can be realized if the optical semiconductor element 40 is an LED and the optical element section 62 has a convex lens. Such a high-brightness light emitting device can be used in a lighting apparatus, display device, traffic signal and the like.

Next, a method for manufacturing the optical module according to this embodiment is described.

Figure 2A:
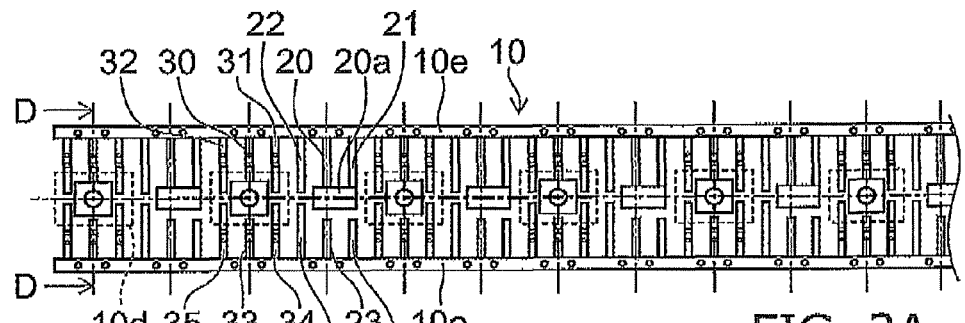
FIGS. 2A to 2F are process sectional views showing a method for manufacturing the optical module according to the first embodiment.
Figure 2B:
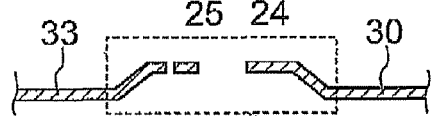

FIGS. 2A to 2F are process cross-sectional views up to lead frame bending. Here, FIG. 2B is a schematic cross-sectional view taken along line D-D in FIG. 2A. A lead frame 10 is illustratively made of an iron-nickel alloy or copper-based material. As shown in FIGS. 2A and 2B, the region including the end portion of the third lead 30, the leads 31, 32, the fourth lead 33, and the leads 34, 35 is formed into a bent portion 10d, which is convex outward illustratively by press working.

Figure 2C:
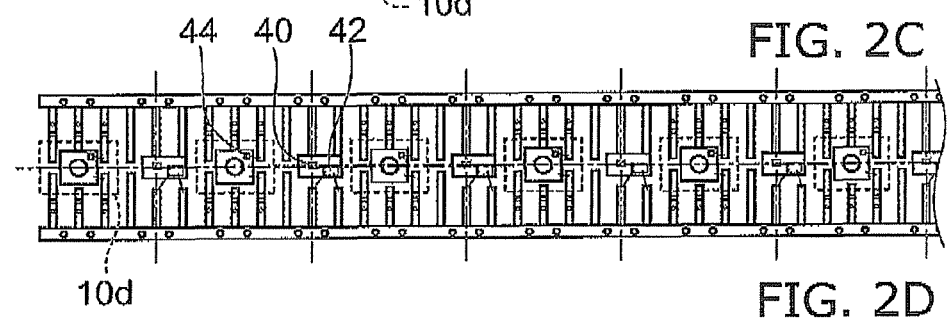

The VCSEL 40 and the driving IC 42 are bonded to the die pad 20a of the first lead 20 using a conductive adhesive or the like. The VCSEL 40 and the driving IC 42 are each connected to a prescribed lead by wire bonding. The photodiode 44 is bonded to the end portion of the third lead 30 and connected to the leads 31, 34 respectively by bonding wires as shown in FIG. 2C.

Figure 2D:
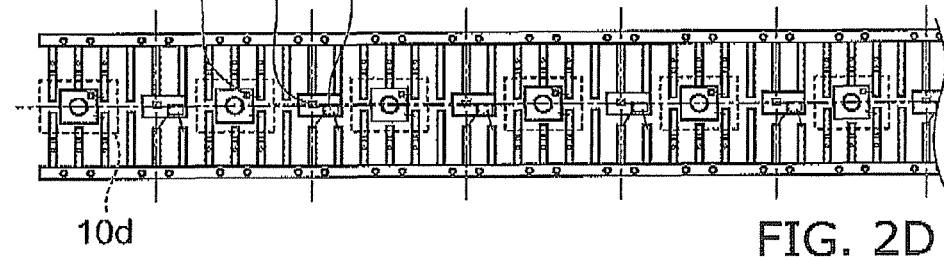

Subsequently, a translucent resin or the like is poured into a mold to form the first and second molded bodies 50, 60 as shown in FIG. 2D. The molded body is illustratively made of a thermosetting resin, such as acrylic resin, epoxy resin, and phenol resin. For the thermosetting resin, a curing process is performed at a prescribed temperature for a prescribed time.

A first lead frame region 11 and a second lead frame region 12 are provided adjacently while sharing frame portions. For instance, as shown in FIG. 2A, the first lead frame region 11 and the second lead frame region 12 are alternately arranged between a pair of upper and lower frame portions extending horizontally.

Figure 2E:
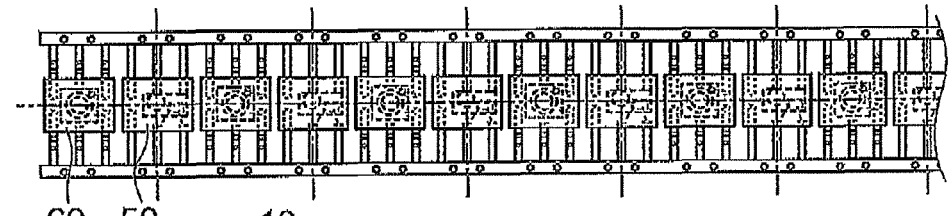
Figure 2E:
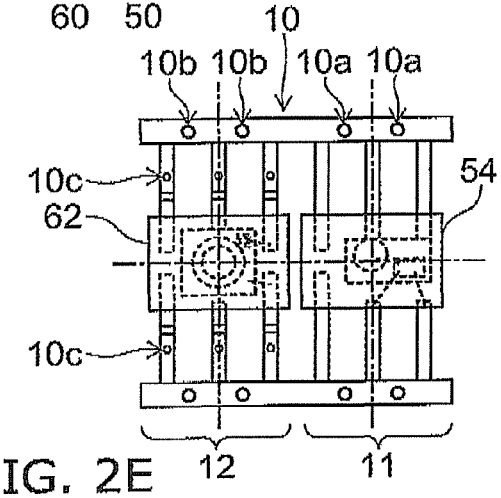
Figure 2F:
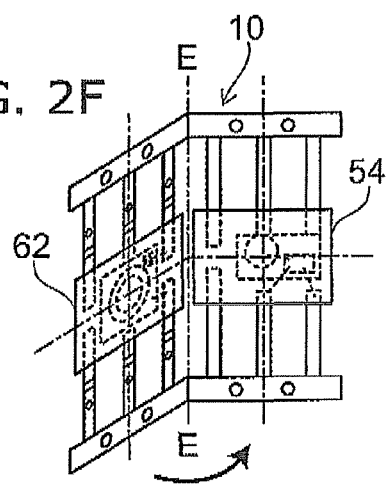

As shown in FIG. 2E, the lead frame 10 is cut so that the optical semiconductor section 54 formed in the first lead frame region 11 is paired with the optical element section 62 formed in the second lead frame region 12. The frame portion of the first lead frame region 11 has a guide hole 10a, and the frame portion of the second lead frame region 12 has a guide hole 10b. The lead on the optical element section 62 side has a through hole 10c. Here, the through hole can be provided in the lead frame on either side. Furthermore, as shown in FIG. 2F, the first and second lead frame regions 11, 12 are folded together along line E-E.

FIGS. 3A to 3D are process cross-sectional views up to lead cutting.

Figure 3A:
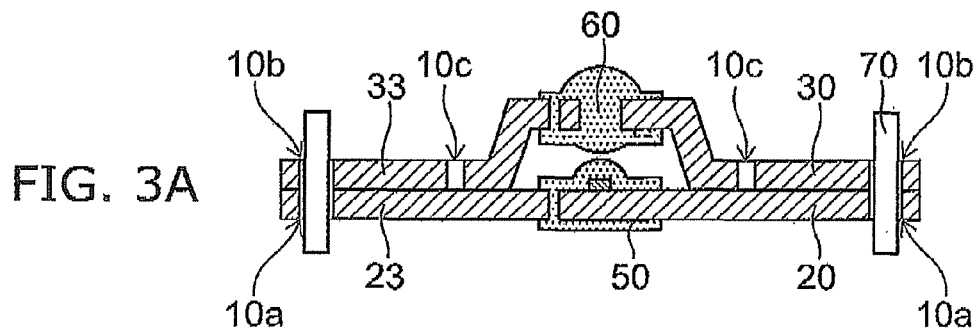
FIGS. 3A to 3D are process sectional views showing the method for manufacturing the optical module according the first embodiment.

The lead frames 10 are superposed together with reference to the guide holes 10a, 10b, and then guide pins 70 are inserted therein as shown in FIG. 3A. The positional accuracy of the guide holes 10a, 10b can be as high as e.g. ±20 μm, and hence they can be superposed together with high positional accuracy.

Figure 3B:
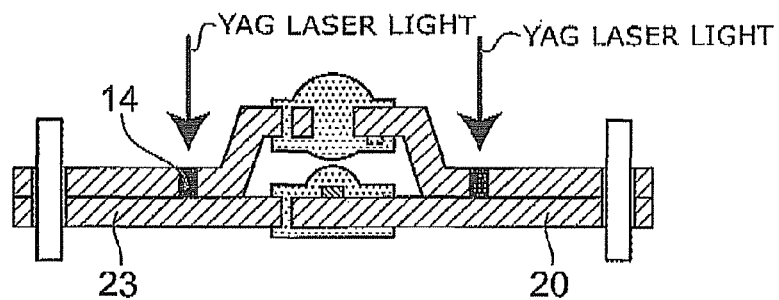

As shown in FIG. 3B, the first lead 20 is exposed to the through hole 10c provided in the third lead 30, and the second lead 23 is exposed to the through hole 10c provided in the fourth lead 33. A metal junction 14 is formed using such methods as YAG laser light irradiation, resistance welding, thermocompression bonding, ultrasonic bonding, and brazing in the region near the inner wall of the through hole 10c. Likewise, metal junctions 14 are formed between the lead 22 and the lead 31, between the lead 21 and the lead 32, between the lead 24 and the lead 35, and between the lead 25 and the lead 34, respectively. Alternatively, a protrusion can be provided on the opposite lead and press-fitted into the through hole 10c.

Figure 3C:
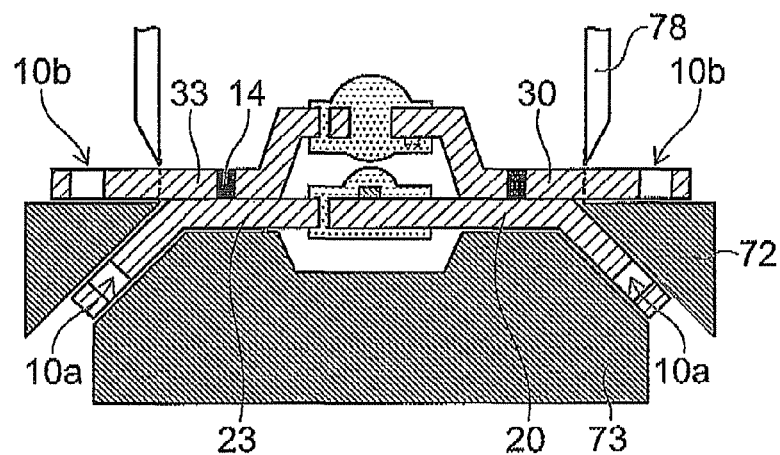
Figure 3D:
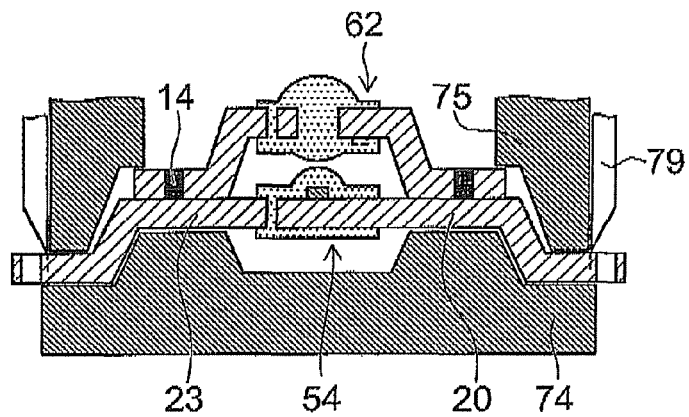

Subsequently, as shown in FIG. 3C, the leads on the optical semiconductor section 54 side are bent using bending dies 72, 73, and the leads on the optical element section 62 side are cut away from the frame portion using a cutting blade 78. Furthermore, as shown in FIG. 3D, the leads on the optical semiconductor section 54 side are further bent using bending dies 74, 75, and cut away from the frame portion using a cutting blade 79. Thus, the optical module is completed.

In the optical module and the method for manufacturing the same according to this embodiment, the alignment accuracy between the optical semiconductor section 54 and the optical element section 62 can be brought close to the working accuracy of the lead frame 10. Furthermore, the molded bodies 50, 60 have high molding accuracy. Hence, by accurately bonding the optical semiconductor element 40 to the lead frame 10, it is easy to maintain high alignment accuracy between the optical axis 52 of the optical semiconductor element 40 and the optical axis of the lens surfaces 50a, 60a formed on the molded bodies 50, 60. Thus, the manufacturing method can achieve high mass productivity.

FIGS. 4A to 4F are process cross-sectional views of a variation of the manufacturing process.

Figure 4A:
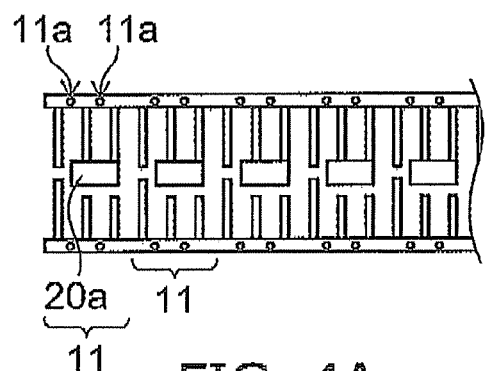
FIGS. 4A to 4F are process sectional views showing a method for manufacturing a variation of the first embodiment.

The optical semiconductor section 54 is formed using a first lead frame region 11 as shown in FIG. 4A.

Figure 4B:
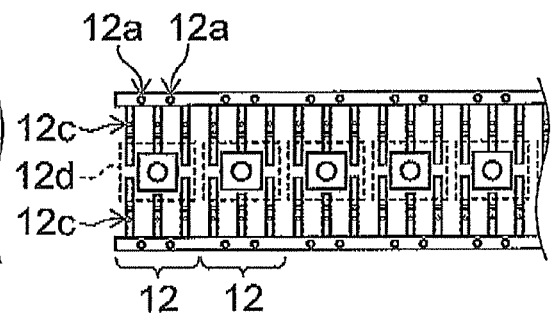

On the other hand, the optical element section 62 is formed using a second lead frame region 12. That is, the optical semiconductor section 54 and the optical element section 62 are formed on different lead frames. Preferably, at least one of the first lead frame region 11 and the second lead frame region 12 is provided with a bent portion so that an outer lead can be superposed later to allow metal junction. In this variation, a bent portion 12d is provided on the second lead frame region 12 side as shown in FIG. 4B.

Figure 4C:
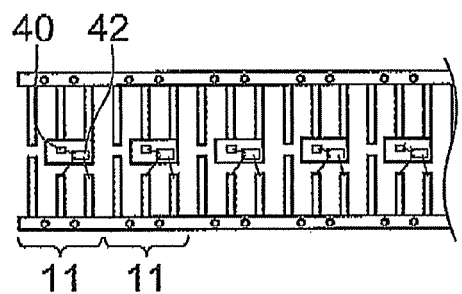
Figure 4D:
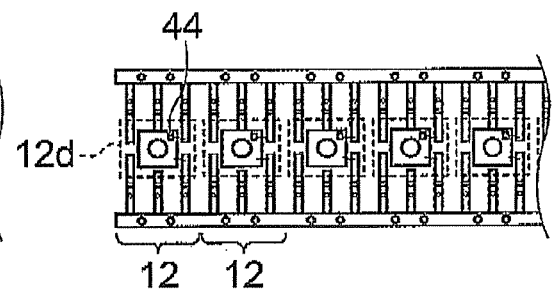

As shown in FIG. 4C, the VCSEL 40 and the driving IC 42 are bonded to the first lead frame region 11 and wire-bonded. Furthermore, as shown in FIG. 4D, the photodiode 44 is bonded to the second lead frame region 12 and wire-bonded.

Figure 4E:
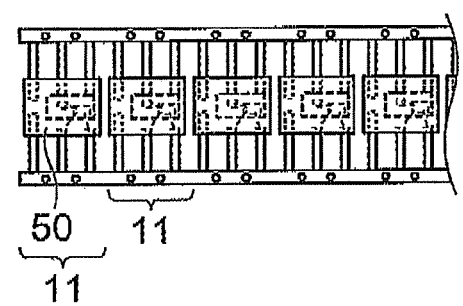
Figure 4F:
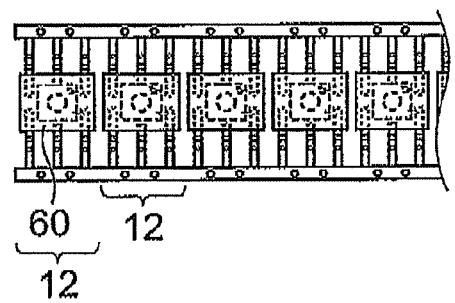

Subsequently, as shown in FIG. 4E, the first molded body 50 is formed in the first lead frame region 11. Furthermore, the second molded body 60 is formed in the second lead frame region 12. The first lead frame region 11 and the second lead frame region 12 are superposed together so that the frontsides thereof as viewed in FIGS. 4E and 4F are opposed to each other, and guide pins or the like are inserted therein to form metal junctions between the leads. Furthermore, as in FIG. 3C, one lead is bent using a bending die, and then the other lead is cut away from the frame portion. Furthermore, as in FIG. 3D, one lead is bent using another bending die and then cut away from the frame portion. Thus, the optical module is completed by being separated from each lead frame.

In this variation, for instance, phosphor particles can be dispersed in the first molded body 50, and a lens or the like is formed in the second molded body 60 without phosphor particles.

Figure 5:
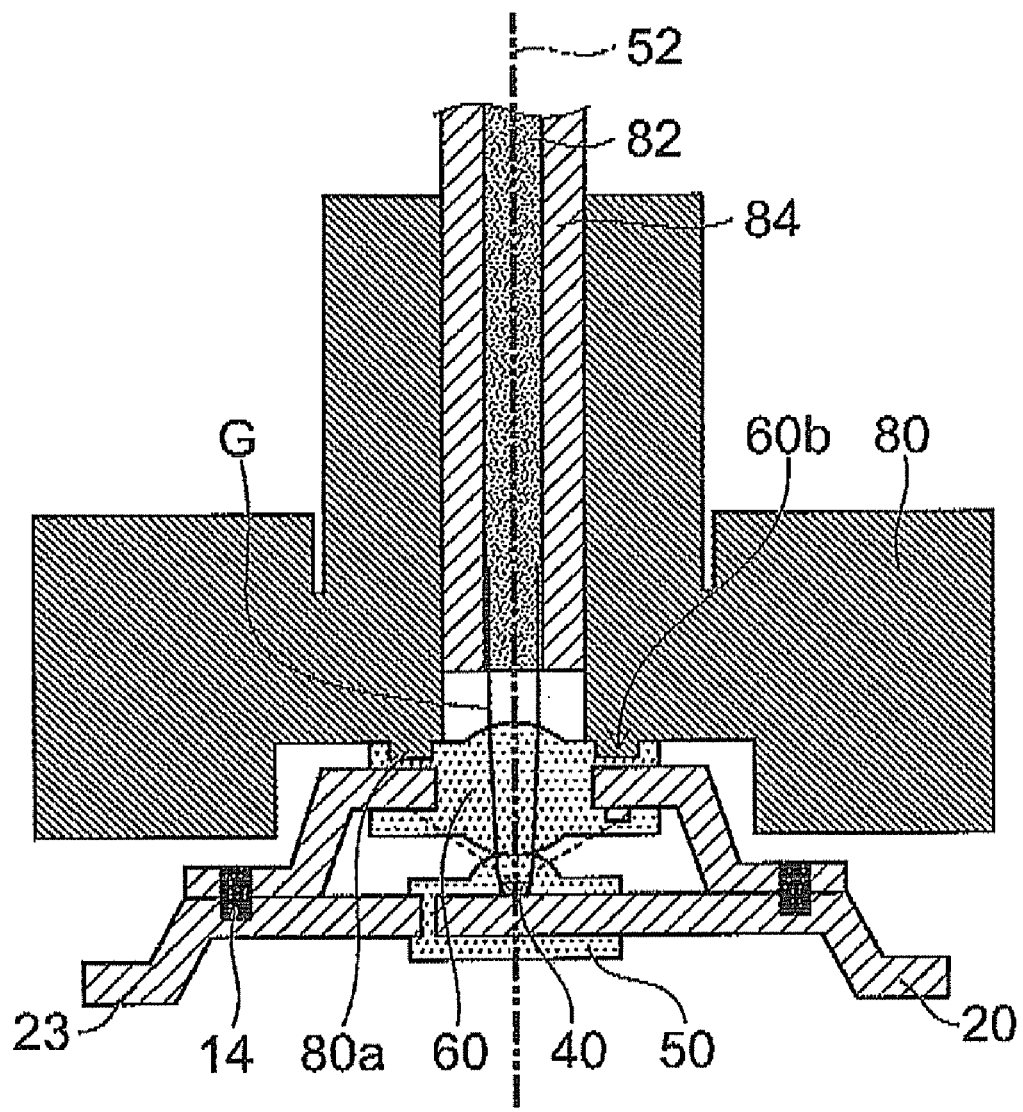
FIG. 5 is a schematic cross-sectional view of an optical module according to a second embodiment.

FIG. 5 is a schematic cross-sectional view of an optical module according to a second embodiment.

The second molded body 60 has a fitting portion, such as a recess 60b. This recess 60b is illustratively formed at positions, which are evenly arranged in four directions with respect to the center of the lens surface 60a as viewed from above. Alternatively, it can be a concentric groove or the like.

On the other hand, the optical module further includes a ferrule guide portion 80. The ferrule guide portion 80 has a through hole in which a ferrule 84 with an optical fiber 82 fixed at its center can be inserted, and a protrusion 80a serving as a fitting portion. That is, the protrusion 80a is fitted into the recess 60b provided in the second molded body 60. Alternatively, the fitting portion of the ferrule guide portion 80 may be a recess, and the fitting portion of the second molded body 60 may be a protrusion. Thus, the optical axis of the optical fiber 82 is readily aligned with high accuracy with the optical axis 52 of the optical semiconductor element 40 and the optical axis of the second molded body 60.

Furthermore, the optical semiconductor section 54 and the optical element section 62 can be each provided with a lens to construct a two-group lens structure, which facilitates increasing the optical coupling efficiency between the VCSEL 40 and the core of the optical fiber 82.

In short-haul transmission, the optical fiber 82 can be a multimode fiber. The multimode fiber can illustratively be an APF (all plastic fiber) made of a plastic core having a diameter of 980 μm and a plastic cladding having a diameter of 1000 μm. Alternatively, the multimode fiber can be a PCF (plastic clad fiber) made of a quartz core having a diameter of 200 μm and a plastic cladding having a diameter of 230 μm. The inner diameter of the ferrule guide portion 80 can illustratively be 2.5 mm.

This facilitates the optical coupling process between the core and the optical semiconductor element 40. The structure of the multimode fiber can be of a step index type or a graded index type.

In the method for manufacturing the optical module according to this embodiment, optical axis alignment between the optical fiber 82 and the optical element 40 is readily achieved. Thus, high mass productivity can be maintained, and consequently, the cost of the optical module can be readily reduced.

Figure 6A:
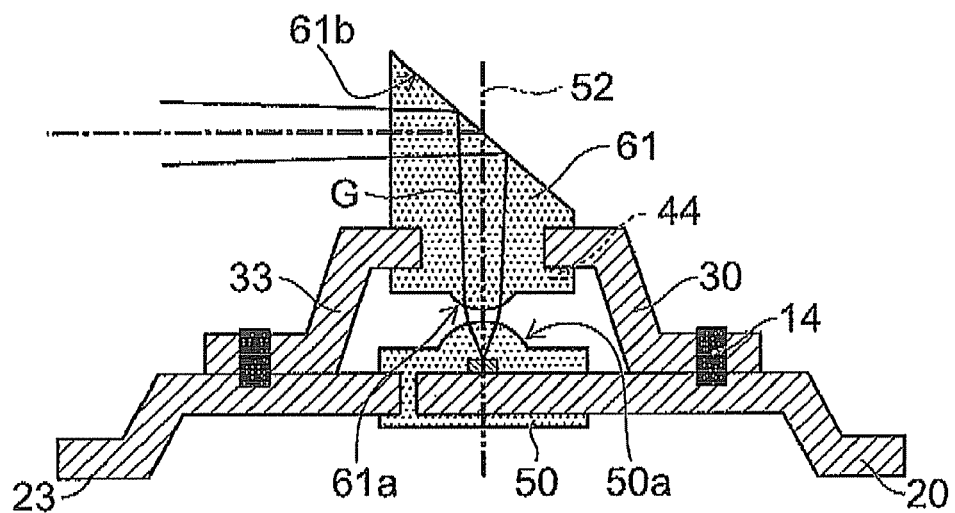
FIGS. 6A and 6B are schematic cross-sectional views of an optical module according to a third embodiment.
Figure 6B:
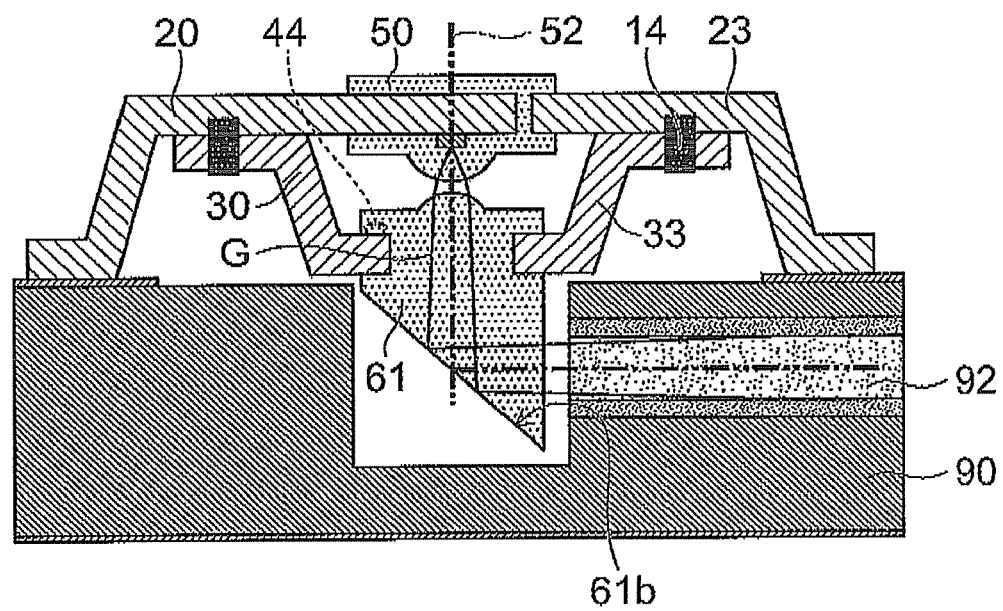

FIG. 6A is a schematic cross-sectional view of an optical module according to a third embodiment, and FIG. 6B is a schematic cross-sectional view showing an application thereof. A second molded body 61 has a convex lens surface 61a serving as an optical element section 62, and a mirror surface 61b serving as a prism.

As shown in FIG. 6A, the emitted light from an LED 40 is converged by the convex lens surface 50a, and then bent generally 45 degrees by the mirror surface 61b so that its optical path is changed. This optical module is attached to an interconnect substrate 90 shown in FIG. 6B. Then, the emitted light G can be injected into an optical waveguide 92 provided in the interconnect substrate 90 so that the light can be transmitted. The module mounted on the interconnect substrate 90 can be used in interconnection between or inside equipments. This facilitates system downsizing.

The third embodiment can be implemented as a side view type light emitting device. More specifically, a nitride LED is used as the optical semiconductor element 40, and phosphor particles are dispersed in the first molded body 50. The second molded body 61 constituting the optical element section 62 contains no phosphor particles and has no photodiode 44. Such optical module can be readily realized by the manufacturing method according to the variation shown in FIG. 4.

When this optical module is mounted on a substrate, the optical path of white light is changed by the second molded body 61 functioning as the prism, and the light is emitted along the substrate. This facilitates injecting white light into the light guide plate of an image display device. In this case, the focal length of at least one of the convex lens surface 50a provided in the first molded body 50 and the convex lens surface 61a provided in the second molded body 61 can be varied to readily change the optical path of the LED and control its beam spread. Furthermore, the distance between the first molded body 50 and the second molded body 61 can be varied to readily change the optical path and control its beam spread. Thus, the degree of freedom in controlling the beam spread is increased. Here, the white light can also be injected into a light guide plate through the optical waveguide 92 shown in FIG. 6B.

Figure 7A:
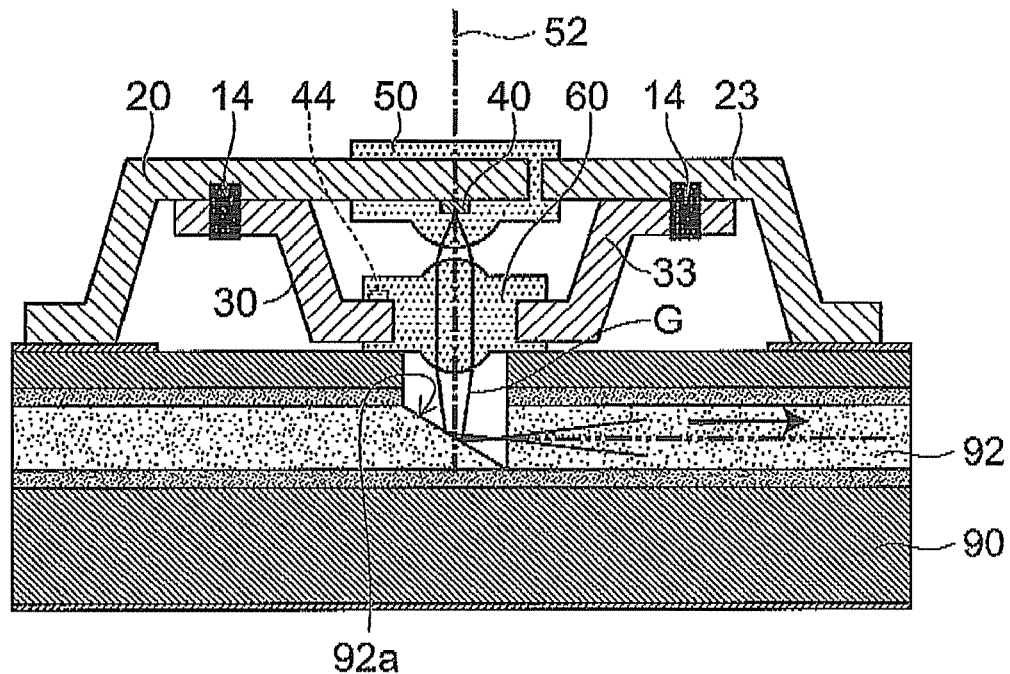
FIGS. 7A and 7B are schematic cross-sectional views of an optical module according to a forth embodiment.
Figure 7B:
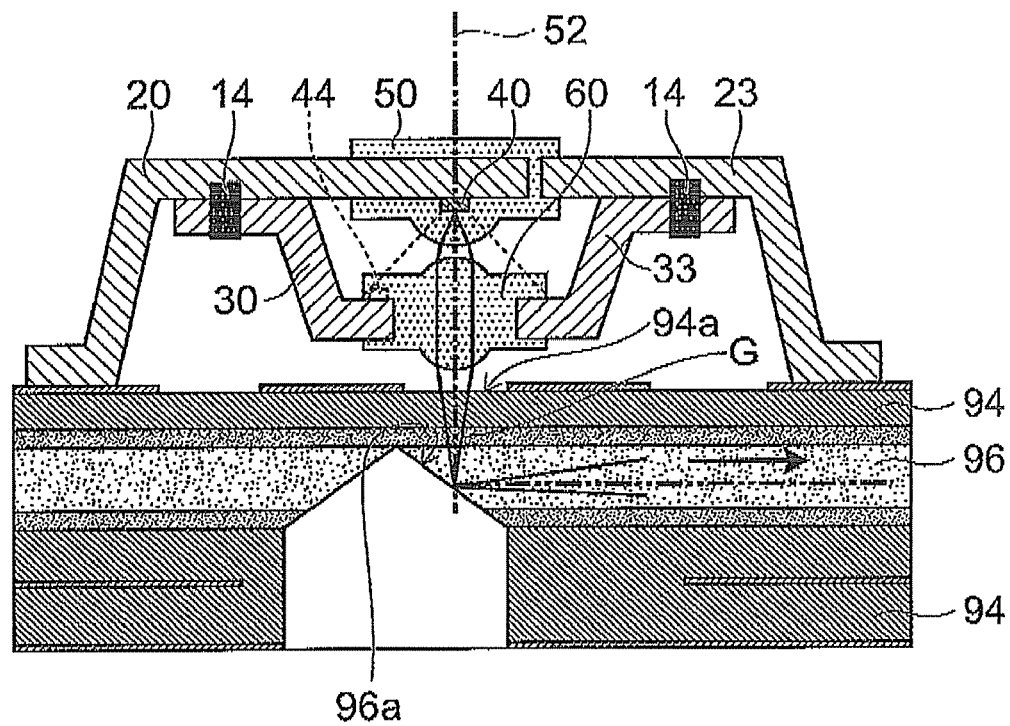

FIG. 7A is a schematic cross-sectional view of an optical module according to a fourth embodiment, and FIG. 7B is a schematic cross-sectional view of a variation thereof.

In FIG. 7A, an optical waveguide 92 is provided in the interconnect substrate 90. Emitted light G converged by the second molded body 60 is folded by a mirror 92a provided in the optical waveguide 92 and travels through the optical waveguide 92 in the direction of the arrow. Because the converged light is injected into the optical waveguide 92, optical loss can be reduced. Thus, the optical module has a reduced consumption power, and can be used for interconnection between and inside equipments.

In the variation of FIG. 7B, the interconnect substrate 94 is illustratively a flexible substrate. An optical waveguide 96 is provided inside an interconnect substrate 94. Emitted light from the LED 40 is converged, and then injected through an optical waveguide injection port 94a provided in the interconnect substrate 94. The light is folded by a mirror 96a provided in the optical waveguide 96 and guided in the optical waveguide 96. In this case, the height of the lens surface provided in the second molded body 60 can be decreased to prevent its surface from abutting the interconnect substrate 94.

Figure 8A:
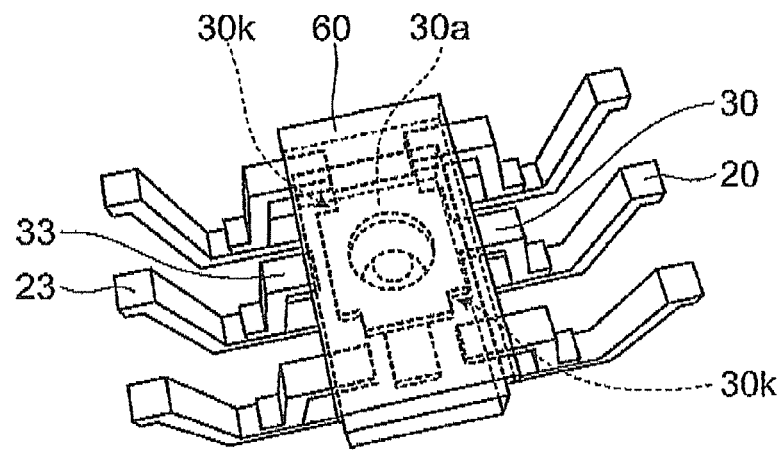
FIG. 8A to 8C are another variations of the forth embodiment.
Figure 8B:
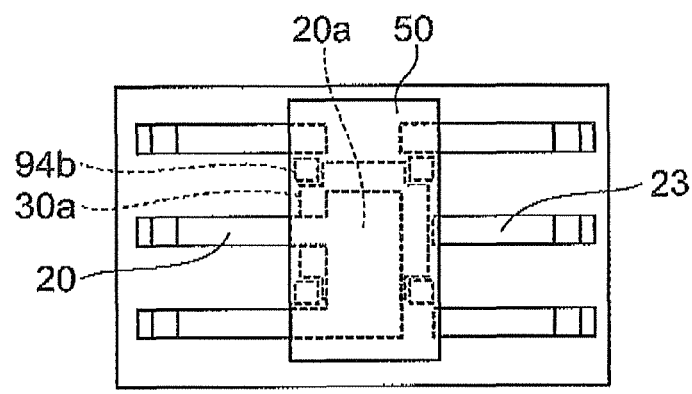
Figure 8C:
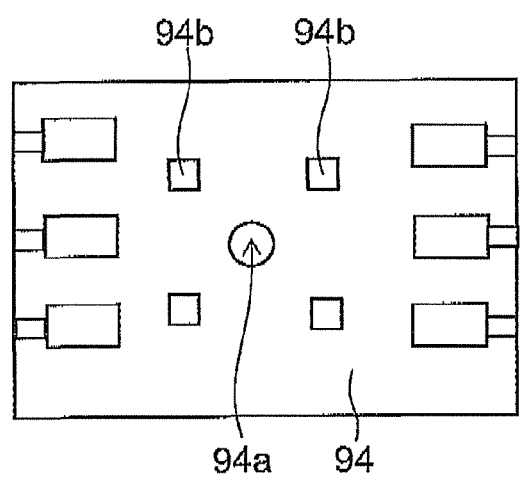

FIG. 8A is a schematic perspective view of an optical module according to another variation of the forth embodiment as viewed from below, FIG. 8B is a schematic plan view thereof, and FIG. 8C is a schematic plan view of the interconnect substrate.

As shown in FIG. 8A, four notches 30k are provided at the corners of the third lead 30a. The first molded body 50 and the second molded body 60 are made of a translucent resin, and hence the notches 30k can be recognized from above. On the other hand, four markers 94b are provided on the surface of the interconnect substrate 94 so as to enable alignment with the notches 30k. Thus, by image recognition from above, the markers 94b of the interconnect substrate 94 can be accurately aligned with the notches 30k.

The embodiments of the invention have been described with reference to the drawings. However, the invention is not limited to these embodiments. Those skilled in the art can variously modify the material, size, shape, layout and the like of the optical semiconductor element, optical element, lead frame, molded body, ferrule guide portion and the like constituting the embodiments of the invention, and such modifications are also encompassed within the scope of the invention unless they depart from the spirit of the invention.

The invention claimed is:

1. An optical module comprising:
an optical semiconductor section including a first lead, a second lead with one end portion opposed to one end portion of the first lead, an optical semiconductor element bonded onto the first lead, and a first molded body in which the optical semiconductor element, the one end portion of the first lead, and the one end portion of the second lead are embedded; and
an optical element section including a third lead, a fourth lead with one end portion opposed to one end portion of the third lead, and a second molded body in which the one end portion of the third lead and the one end portion of the fourth lead are embedded and which can change the optical path of at least one of emitted light from the optical semiconductor element and incident light on the optical semiconductor element, the other end portion of the first lead and the other end portion of the second lead protruding from the first molded body in directions opposite to each other, the other end portion of the third lead and the other end portion of the fourth lead protruding from the second molded body in directions opposite to each other, the protruding first lead and the protruding third lead being joined to form a metal junction, the protruding second lead and the protruding fourth lead being joined to form a metal junction, and at least one of the first and second leads and the third and fourth leads having a bent portion which is convex outward.

2. The optical module according to claim 1, wherein
the optical semiconductor element is a light emitting element, and
the second molded body has a converging lens surface.

3. The optical module according to claim 2, wherein the third and fourth leads have a bent portion which is convex outward.

4. The optical module according to claim 2, wherein the first molded body has a converging lens surface.

5. The optical module according to claim 1, wherein the optical semiconductor element is a light receiving element.

6. The optical module according to claim 1, wherein the first molded body and the second molded body are made of one of acrylic resin, epoxy resin, and phenol resin, respectively.

7. An optical module comprising:
an optical semiconductor section including a first lead, a second lead with one end portion opposed to one end portion of the first lead, an optical semiconductor element bonded onto the first lead, and a first molded body in which the optical semiconductor element, the one end portion of the first lead, and the one end portion of the second lead are embedded;
an optical element section including a third lead, a fourth lead with one end portion opposed to one end portion of the third lead, and a second molded body in which the one end portion of the third lead and the one end portion of the fourth lead are embedded and which can converge at least one of emitted light from the optical semiconductor element and incident light on the optical semiconductor element; and
a ferrule guide portion including a fitting portion fitted with the second molded body and a through hole in which an optical fiber can be inserted,
the other end portion of the first lead and the other end portion of the second lead protruding from the first molded body in directions opposite to each other,
the other end portion of the third lead and the other end portion of the fourth lead protruding from the second molded body in directions opposite to each other,
the protruding first lead and the protruding third lead being joined to form a metal junction,
the protruding second lead and the protruding fourth lead being joined to form a metal junction, and
at least one of the first and second leads and the third and fourth leads having a bent portion which is convex outward.

8. The optical module according to claim 7, wherein
the optical semiconductor element is a light emitting element, and
the second molded body has a converging lens surface.

9. The optical module according to claim 8, wherein the third and fourth leads have a bent portion which is convex outward.

10. The optical module according to claim 8, wherein the first molded body has a converging lens surface.

11. The optical module according to claim 8, wherein an integrated circuit capable of driving the light emitting element is embedded in the first molded body.

12. The optical module according to claim 7, wherein the optical semiconductor element is a light receiving element.

13. The optical module according to claim 1, wherein the second molded body can change the optical path of the optical semiconductor element so that the optical path is generally parallel to a surface to which the optical semiconductor element is bonded.

14. The optical module according to claim 13, wherein
the optical semiconductor element is a light emitting element, and
the second molded body has a folded mirror surface.

15. The optical module according to claim 14, wherein the second molded body further includes a converging lens surface.

16. The optical module according to claim 14, wherein
the light emitting element is made of a nitride material, and
the first molded body includes dispersed phosphor particles which can absorb the emitted light from the light emitting element and emit wavelength-converted light.

17. A method for manufacturing an optical module, comprising:
bonding an optical semiconductor element onto a first lead of a first lead frame region which includes the first lead, a second lead with one end portion opposed to one end portion of the first lead, and a frame portion supporting the first and second lead;
forming a first molded body so that the one end portion of the first lead, the one end portion of the second lead, and the optical semiconductor element are embedded therein and that the other end portion of the first lead and the other end portion of the second lead protrude therefrom in directions opposite to each other;
forming a second molded body, on a second lead frame region which includes a third lead, a fourth lead with one end portion opposed to one end portion of the third lead, and a frame portion supporting the third and fourth lead, so that the one end portion of the third lead and the one end portion of the fourth lead are embedded therein and that the other end portion of the third lead and the other end portion of the fourth lead protrude therefrom in directions opposite to each other;
forming a metal junction by joining the first and third leads with the second and fourth leads while aligning a guide hole provided in the frame portion of the first lead frame region with a guide hole provided in the frame portion of the second lead frame region;
cutting the first and second leads away from the frame portion of the first lead frame region; and
cutting the third and fourth leads away from the frame portion of the second lead frame region.

18. The method for manufacturing an optical module according to claim 17, wherein
the first lead frame region and the second lead frame region are provided adjacently in a lead frame, and
the forming a metal junction includes superposing the first lead frame region and the second lead frame region by folding the lead frame.

19. The method for manufacturing an optical module according to claim 17, wherein
the first lead frame region is provided in a first lead frame,
the second lead frame region is provided in a second lead frame, and
the forming a metal junction includes superposing the first and second lead frames.

20. The method for manufacturing an optical module according to claim 17, wherein the forming a metal junction uses one method of YAG laser light irradiation, resistance welding, thermocompression bonding, ultrasonic bonding, and brazing.

* * * * *